United States Patent [19]
Moore et al.

[11] Patent Number: 5,840,451
[45] Date of Patent: Nov. 24, 1998

[54] INDIVIDUALLY CONTROLLABLE RADIATION SOURCES FOR PROVIDING AN IMAGE PATTERN IN A PHOTOLITHOGRAPHIC SYSTEM

[75] Inventors: Bradley T. Moore; Robert Dawson; H. Jim Fulford, Jr., all of Austin; Mark I. Gardner, Cedar Creek; Frederick N. Hause, Austin; Mark W. Michael, Cedar Park; Derick J. Wristers, Austin, all of Tex.

[73] Assignee: Advanced Micro Devices, Inc., Sunnyvale, Calif.

[21] Appl. No.: 760,029

[22] Filed: Dec. 4, 1996

[51] Int. Cl.$^6$ .................................................. G03F 9/00
[52] U.S. Cl. ........................ 430/30; 430/311; 430/322; 430/325; 430/326; 430/945; 430/967
[58] Field of Search .............................. 430/30, 311, 322, 430/325, 326, 945, 967

[56] References Cited

U.S. PATENT DOCUMENTS

| | | | |
|---|---|---|---|
| 5,193,008 | 3/1993 | Frazier et al. | 358/298 |
| 5,300,956 | 4/1994 | Ohta et al. | 346/107 R |
| 5,389,959 | 2/1995 | Haas | 347/187 |
| 5,636,004 | 6/1997 | Ootaka et al. | 430/311 |
| 5,728,495 | 3/1998 | Ozawa | 430/30 |

*Primary Examiner*—Christopher G. Young
*Attorney, Agent, or Firm*—Skjerven, Morrill, MacPherson, Franklin & Friel, LLP; David M. Sigmond

[57] ABSTRACT

A photolithographic system includes individually controllable radiation sources for forming an image pattern on an image plane without using a reticle or mask during fabrication of an integrated circuit device. The radiation sources are selectively activated as they scan the image plane. The image pattern can consist of parallel lines having identical widths and varying lengths, or alternatively, pixels having identical shapes and sizes. The radiation sources can be arranged as a linear array, or a staggered array, to achieve the desired linear density. Suitable radiation sources include light pipes, light emitting diodes, and laser diodes. Preferably, each of the activated radiation sources provides an exposure field of less than 0.1 microns on the image plane, and at least two of the radiation sources must be activated to provide the minimum line width of the image pattern.

48 Claims, 6 Drawing Sheets

INDIVIDUALLY CONTROLLABLE RADIATION SOURCES FOR PROVIDING AN IMAGE PATTERN IN A PHOTOLITHOGRAPHIC SYSTEM

BACKGROUND OF THE INVENTION

1. Field of the Invention

The present invention relates to radiation sources, and more particularly to radiation sources in photolithographic systems used for fabricating integrated circuit devices.

2. Description of Related Art

Integrated circuit device fabrication requires that precisely controlled quantities be introduced into or deposited onto tiny regions of a wafer or substrate. In many of the processing steps, material is overlayed or removed from the existing layer at specific regions in order to form the desired elements of an integrated circuit device. Photolithography is frequently used to create patterns that define these regions. Typically, the wafer is cleaned and prebaked to drive off moisture and promote adhesion, an adhesion promoter is deposited on the wafer, a few milliliters of photoresist are deposited onto the spinning wafer to provide a uniform layer, the wafer is soft baked to drive off remaining solvents, the wafer is put into a photolithographic system and exposed to a radiation pattern, and then the photoresist is developed. If positive photoresist is used then the developer removes the irradiated regions, whereas if negative photoresist is used then the developer removes the non-irradiated regions. The photoresist is further hard baked to improve its resistance, and then the wafer is subjected to an additive process (such as ion implantation) or a subtractive process (such as etching) using the photoresist as a mask. Thereafter, the photoresist is stripped.

Photolithographic systems often use a radiation source and a lens in conjunction with a mask or reticle to selectively irradiate the photoresist. The radiation source projects radiation through the mask or reticle to the lens, and the lens focuses an image of the mask or reticle onto the wafer. A mask transfers a pattern onto the entire wafer (or another mask) in a single exposure step, whereas a reticle transfers a pattern onto only a portion of the wafer.

The three major methods of optically transferring a pattern on a mask or reticle to a photoresist-coated wafer include contact printing, proximity printing, and projection printing. In contact printing, the mask is clamped against a photoresist-coated wafer. Although this optimizes image transfer and resolution, the contacting process results in mask defects. In proximity printing, the mask and photoresist are spaced by a small distance. Although this overcomes the defect problems associated with contact printing, it also requires extremely flat wafers and masks. In projection printing, lens elements or mirrors are used to focus the mask or reticle image on the photoresist, which is spaced from the mask or reticle by a large distance. Several projection printing techniques have been developed, including projection scanners and step and repeat systems. Projection scanners use a reflective spherical mirror to project the mask onto the wafer by scanning the wafer and the mask with a narrow arc of radiation. Step and repeat systems (steppers) project an image only onto a portion of the wafer. Multiple images of the reticle pattern are stepped and repeated over the entire wafer using multiple exposures. The reticle pattern is typically 2× to 10× the size of the image on the wafer due to reduction by the lens. However, non-reduction (1×) steppers offer a larger field, thereby allowing more than one pattern to be printed at each exposure.

Photolithographic systems often use a mercury-vapor lamp as the illumination source. In mercury-vapor lamps, a discharge arc of high-pressure mercury vapor emits a characteristic spectrum that contains several sharp lines in the ultraviolet region—the I-line (365 mn), the H-line (405 nm) and the G-line (436 nm). Photolithographic systems are designed, for instance, to operate using the G-line, the I-line, a combination of the lines, or at deep UV (240 nm). To obtain the proper projection, high power mercury-vapor lamps are used that draw 200 to 1,000 watts and provide ultraviolet intensity on the order of 100 milliwatts/cm$^2$. In some systems, air jets cool the lamp, and the heated air is removed by an exhaust fan.

In step and repeat systems, the reticle is typically composed of quartz with relatively defect-free surfaces and a high optical transmission at the radiation wavelength. Quartz has a low thermal expansion coefficient and high transmission for near and deep ultraviolet light. Although quartz tends to be expensive, it has become more affordable with the development of high quality synthetic quartz material.

The reticle is prepared by cutting a large quartz plate which is polished and cleaned, and then coated with a mask forming material such as chrome or iron oxide. Chrome is the most widely used material and is typically deposited by sputtering or evaporation to a thickness of less than 1,000 angstroms. The chrome is then selectively removed to form the pattern. For instance, a very thin layer of photoresist is deposited on the chrome and patterned (either optically or by an electron beam) by imaging and exposing a set of accurately positioned rectangles, and then a wet etch is applied. Patterning the reticle for a complex VLSI circuit level may require in excess of 100,000 rectangle exposures over a 10 hour period. During this period, extreme temperature control is often necessary to prevent positional errors. As a result, reticle errors may arise, and the quality of the reticle cannot be ascertained until after the chrome is etched.

Lens errors in step and repeat systems are also undesirable since they disrupt the pattern transfer from the reticle to the photoresist, which in turn introduces flaws into the integrated circuit manufacturing process. Lens errors include a variety of optical aberrations, such as astigmatism and distortion. Astigmatism arises when the lens curvature is irregular. Distortion arises when the lens magnification varies with radial distance from the lens center. For instance, with positive or pincushion distortion, each image point is displaced radially outward from the center and the most distant image points are displaced outward the most. With negative or barrel distortion, each image point is displaced radially inward toward the center and the most distant image points are displaced inward the most. Accordingly, the lens error is frequently measured so that corrections or compensations can be made.

Reticles often have unique patterns that expose some lens portions to far more radiation than others. Since the radiation has high intensity and the lens has low thermal conductivity, a portion of the lens subjected to a large amount of radiation is likely to get far hotter than a portion of the lens subjected to little or no radiation. Therefore, the particular reticle dictates the pattern of localized lens heating. Furthermore, since the lens has a given thermal coefficient of expansion, the lens dimensions change as a function of lens heat. Accordingly, the lens error arises not only from inherent lens flaws, but also from lens heating. Moreover, the lens error associated with lens heating depends on the specific reticle pattern.

While optical photolithography continues to be the dominant technology because it is well established and is capable of implementing sub-micron resolution at least as low as 0.35 microns using current equipment, as feature sizes approach 0.5 microns and below, and these features extend across wafer areas of a square inch and more, extensive efforts are being directed at developing alternative technologies. Electron-beam, ion-beam, and x-ray technologies have demonstrated patterning capabilities that extend beyond the limits of optical systems. Electron-beams and ion-beams can also directly write image patterns onto the photoresist without the use of a mask or reticle, for instance by using a controlled stage to position the wafer beneath the tool. However, these alternative approaches have certain drawbacks. For instance, electron-beam lithography has low throughput, x-ray lithography has difficulties with fabricating suitable masks, and ion-beam lithography has low throughput and difficulties with obtaining reliable ion sources.

Thus, workers in the art recognize that there are obvious incentives for trying to push the currently dominant technology (optical photolithography) into the fine-line region. Such an effort, if successful, has the potential for retrofitting or modifying expensive equipment to give it significantly better patterning capabilities.

Accordingly, a need exists for improvements in photolithography that facilitate forming fine-line patterns, that are well-suited for optical photolithographic systems, and that reduce or eliminate reticle errors and lens errors.

SUMMARY OF THE INVENTION

An object of the invention is to provide an improved photolithographic system. More specifically, an object of this invention is to provide a photolithographic system that is well-suited for fabricating high-quality fine-line integrated circuit devices. Another objective of the invention is to reduce or eliminate lens errors and reticle errors in optical photolithographic systems. The present invention achieves these objectives by using individually controllable radiation sources.

In accordance with one aspect of the invention, a photolithographic system includes individually controllable radiation sources for forming an image pattern on an image plane without using a reticle or mask during fabrication of an integrated circuit device. The radiation sources are selectively activated as they scan the image plane. The image pattern may consist of parallel lines having essentially identical widths and varying lengths, or alternatively, pixels with essentially identical shapes and sizes. The radiation sources can be arranged, for instance, as a linear array with a single row, or a staggered array with multiple rows, to achieve the desired linear density. Suitable radiation sources include light pipes, light emitting diodes, and laser diodes.

Preferably, the radiation sources emit ultraviolet light or x-rays to form the desired image pattern on a photosensitive material on a wafer. Thereafter, the photosensitive material is developed to expose portions of the wafer corresponding to the image pattern in conjunction with fabricating an integrated circuit device.

Advantageously, the radiation sources are well-suited for patterning features of 0.5 microns and below. Furthermore, the radiation sources can replace the conventional mercury-vapor lamp, reticle, and lens combination used in step and repeat systems, thereby reducing or eliminating various problems such as reticle errors, inherent lens errors, and lens heating errors associated with the particular reticle pattern.

These and other objects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1:
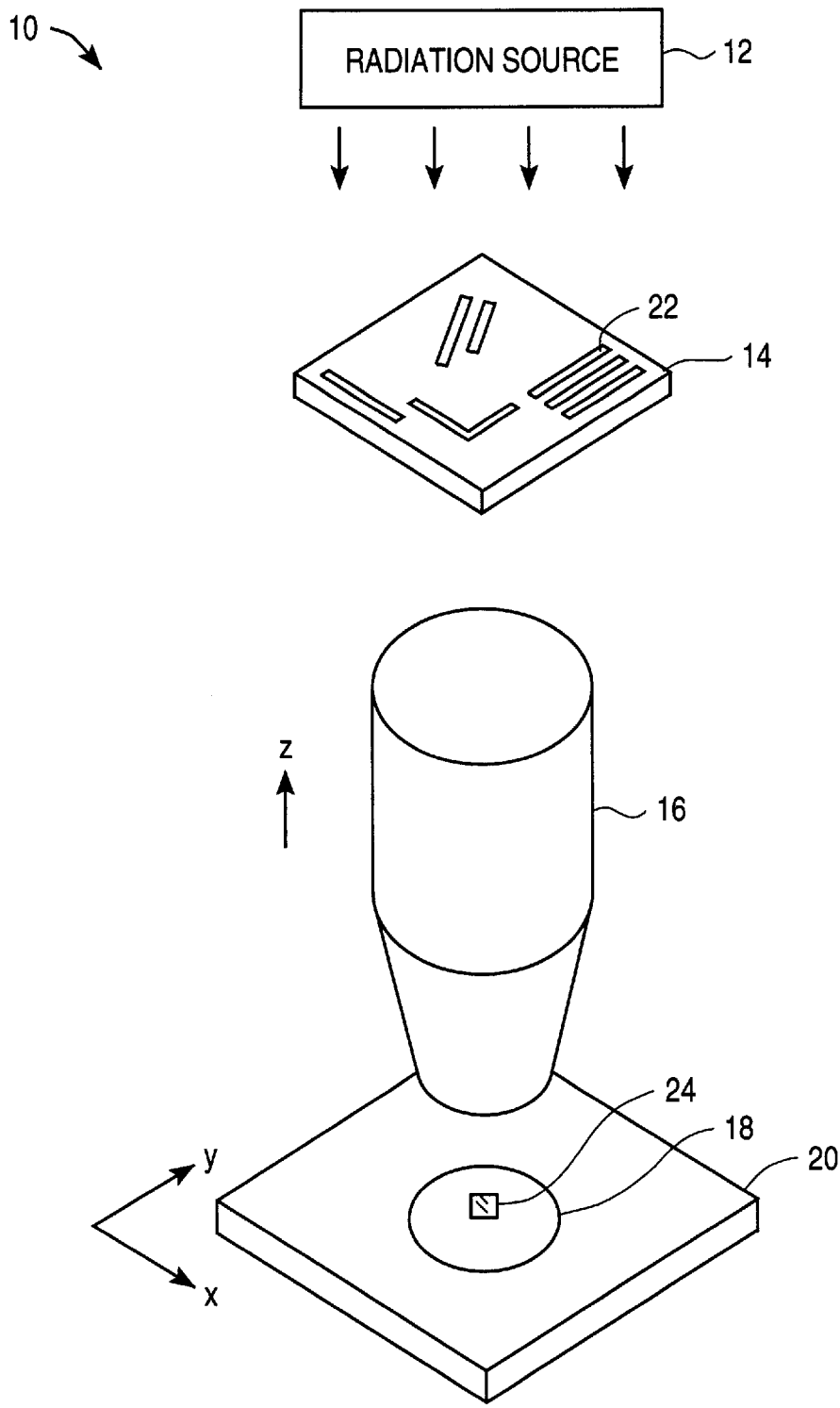
FIG. 1 is a perspective view showing a typical arrangement of a step and repeat system.

In the drawings, depicted elements are not necessarily drawn to scale and like or similar elements may be designated by the same reference numeral throughout the several views.

FIG. 1 is a perspective view showing a typical arrangement of a step and repeat system for fabricating integrated circuit devices. System 10 includes radiation source 12, reticle 14, lens 16, and wafer 18 mounted on x-y stepping table 20. Radiation source 12 is a single, stationary mercury-vapor lamp for generating I-line ultraviolet light. Reticle 14 includes a chrome pattern on a quartz base, with optically transparent lines 22 between regions of chrome for transferring a radiation pattern. Lens 16 focuses the radiation pattern onto portion 24 of photoresist-coated wafer 18. A computer (not shown), which is a standard digital data processor, controls the motion of stepping table 20 in the x-y direction for step and repeat operation, and the motion of lens 16 in the z direction for focusing the radiation pattern. Mechanisms to move the reticle, lens, and wafer in the x, y or z directions in response to electrical control signals are well-known in the art. Step and repeat systems typically include other conventional optical elements (not shown) such as mirrors, filters and condenser lenses.

Figure 2:
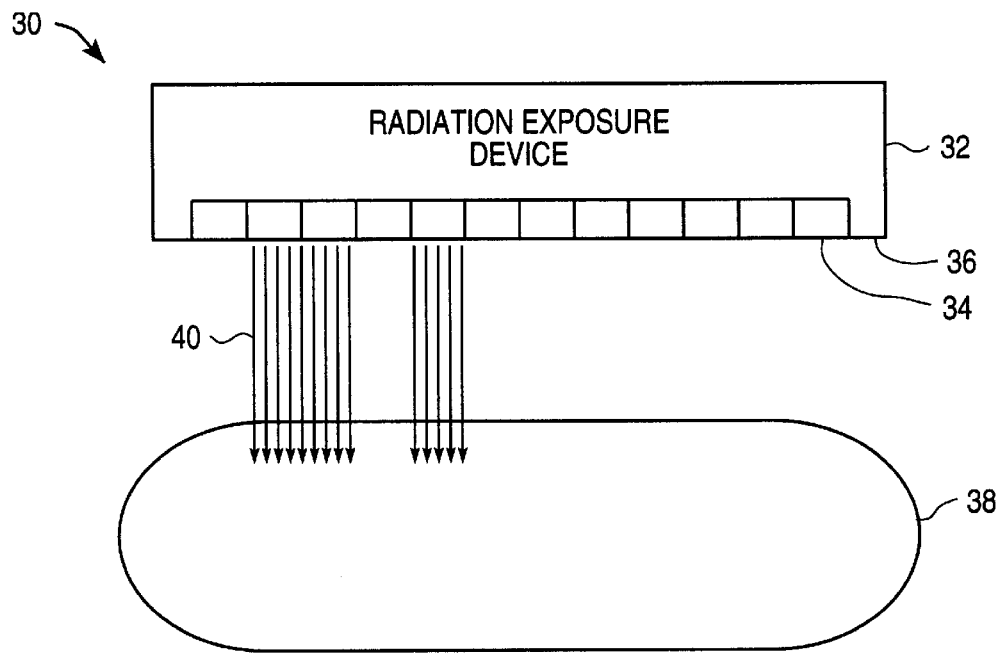
FIG. 2 is a perspective view showing a photolithographic system with individually controllable radiation sources in accordance with the invention.

FIG. 2 is a perspective view showing a photolithographic system in accordance with the invention. System 30 includes radiation exposure device 32 in lieu of radiation source 12, reticle 14, and lens 16. Radiation exposure device 32 includes individually controllable radiation sources 34 capable of selectively projecting radiation from bottom surface 36 to photoresist-coated wafer 38. Radiation sources 34 are disposed at different locations of a uniform repeating pattern and are independently operable, but otherwise are essentially identical, particularly with respect to dimensions, projected radiation, and exposure fields. For illustration purposes, the second, third and fifth radiation sources 34 (counting from the left) are activated and therefore project radiation (shown as arrows 40) orthogonally from bottom surface 36 towards selected regions of wafer 38, whereas the other radiation sources 34 are deactivated and therefore fail to project radiation. Radiation sources 34 are designed to scan or sweep across wafer 38 to form an image pattern on the photoresist, without using a reticle or mask, during the fabrication of integrated circuit devices disposed in wafer 38. As scanning occurs, radiation sources 34 are selectively activated and deactivated to form the desired image pattern. For instance, radiation sources 34 can be activated and deactivated to form an image pattern consisting of parallel lines having varying lengths. Alternatively, radiation sources 34 can be operated in a manner analogous to laser printing to form an image pattern consisting of individual pixels. Advantageously, radiation sources 34 avoid conventional lens errors and reticle errors associated with step and repeat systems. Furthermore, radiation sources 34 are capable of scanning wafer 38 over a wide area without significant disruption in image pattern fidelity. Suitable radiation sources include light pipes, light emitting diodes, and laser diodes. Preferably, the radiation sources that are activated emit either ultraviolet light or x-rays to form the desired image pattern on the photoresist. Thereafter, the photoresist is developed to expose portions of wafer 38 corresponding to the image pattern in conjunction with fabricating integrated circuit devices.

Figure 3:
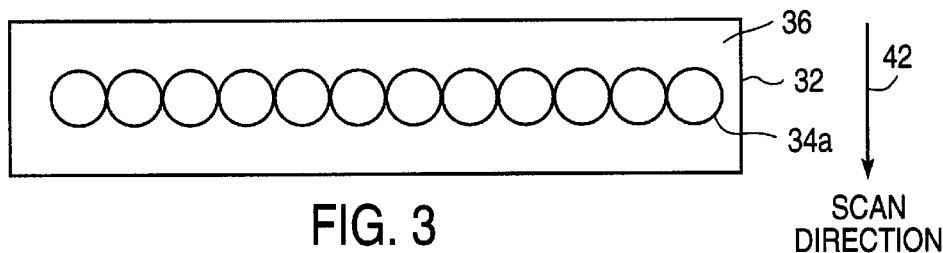
FIG. 3 is a plan view of the radiation sources arranged as a linear array.

FIG. 3 is a plan view of radiation sources 34a (representing radiation sources 34) arranged as a linear array in a single row. Radiation sources 34a, as seen along bottom surface 36 of radiation exposure device 32, and facing wafer 38, are disposed close enough to one another to achieve the desired linear density. Radiation sources 34a scan wafer 38 in the direction orthogonal to the row, as depicted by scan arrow 42.

Figure 4:
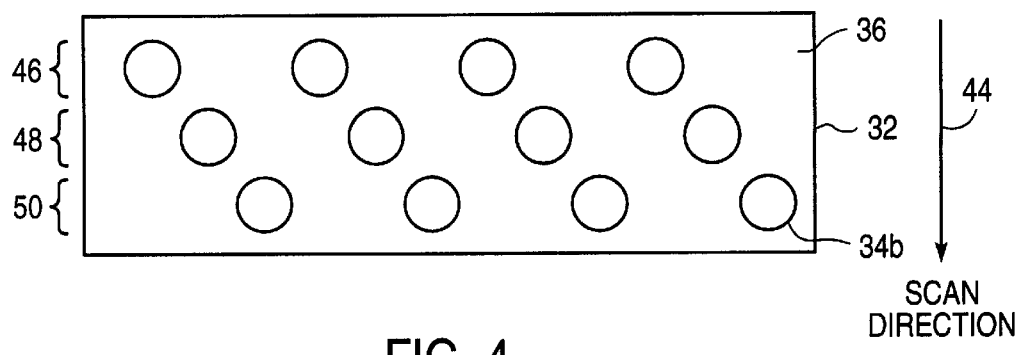
FIG. 4 is a plan view of the radiation sources arranged as a staggered array.

FIG. 4 is a plan view of the radiation sources 34b (representing radiation sources 34) arranged as a staggered array of multiple rows. Radiation sources 34b provide an alternative arrangement to radiation sources 32a. Radiation sources 34b, as seen along bottom surface 36 of radiation exposure device 32, and facing wafer 38, are arranged in staggered rows 46, 48 and 50. Radiation sources 34b in a particular row are not disposed close enough to one another to achieve the desired linear density. For instance, radiation sources 34b can be implemented by relatively wide light pipes with narrow distal ends along bottom surface 36 to improve focusing. The width of such light pipes prevents forming the narrow distal ends adjacent to one another. However, rows 46, 48 and 50 are offset diagonally relative to one another. As a result, the combination of rows 46, 48 and 50 achieves the desired linear density. Radiation sources 34b scan wafer 38 in the direction orthogonal to the rows, as depicted by scan arrow 44.

Figure 5:
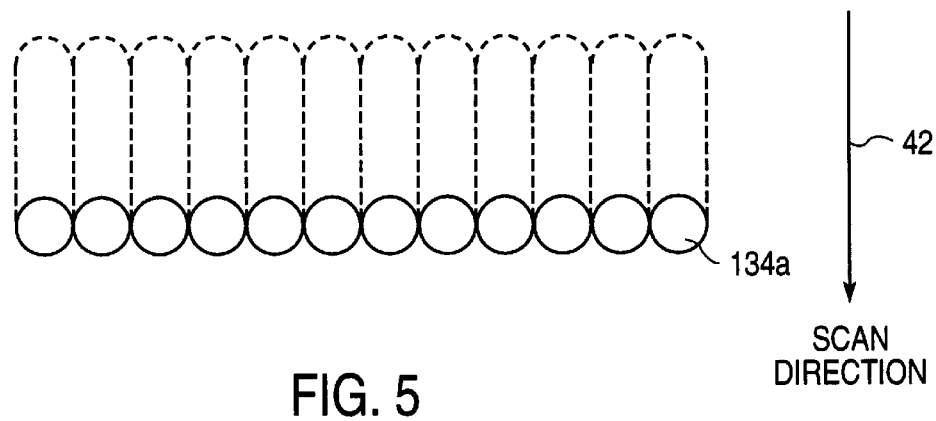
FIG. 5 is a plan view of exposure fields for the radiation sources of FIG. 4.

FIG. 5 is a plan view of the exposure fields associated with radiation sources 34a. For illustration purposes, all the radiation sources 34a are activated during the entire depicted scan. Exposure fields 134a correspond in one-to-one relationship to the dimensions and positions of radiation sources 34a, and are essentially identical to one another. As radiation sources 34a are scanned relative to wafer 38, exposure fields 134a are swept across wafer 38 in the direction of scan arrow 42. As a result, exposure fields 134a provide swept lines (depicted by the broken lines) of irradiation that are parallel to one another, adjacent to one another, have the same width as exposure fields 134a, and have indefinite length.

Figure 6:
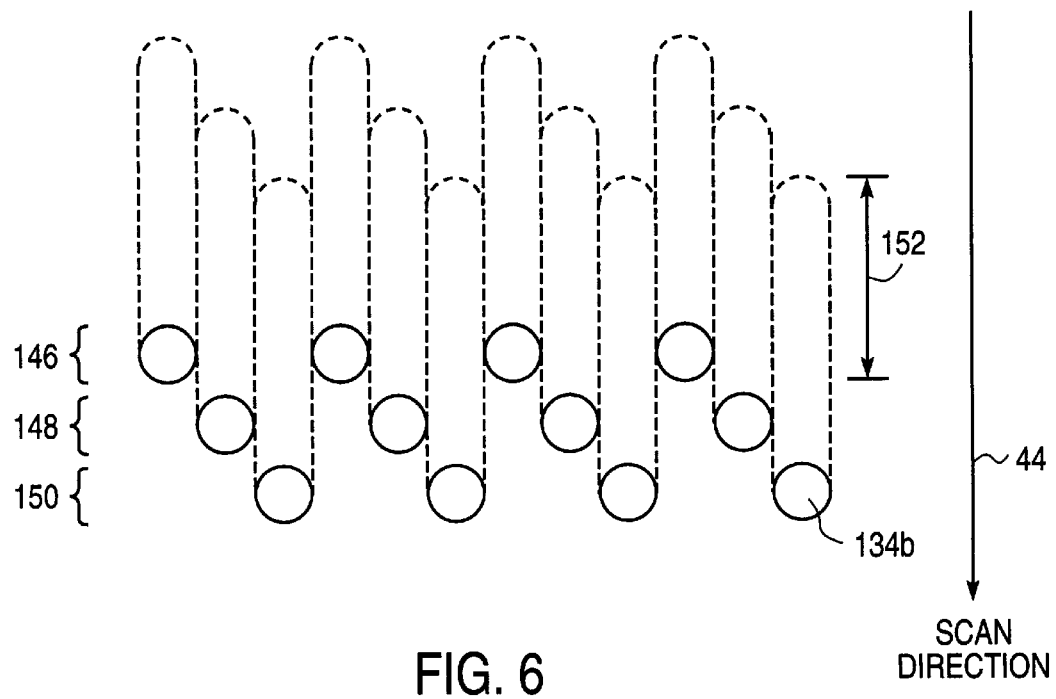
FIG. 6 is a plan view of exposure fields for the radiation sources of FIG. 5.

FIG. 6 is a plan view of the exposure fields associated with radiation sources 34b. For illustration purposes, all the radiation sources 34b are activated during the entire depicted scan. Exposure fields 134b correspond in one-to-one relationship to the dimensions and positions of radiation sources 34b, and are essentially identical to one another. Likewise, rows 146, 148 and 150 of exposure fields 134b correspond to rows 46, 48 and 50, respectively, of radiation sources 34b. As radiation sources 34b are scanned relative to wafer 38, exposure fields 134b are swept across wafer 38 in the direction of scan arrow 44. As a result, exposure fields 134b provide swept lines (depicted by the broken lines) of irradiation that are parallel to one another, have the same width as exposure fields 134b, and have indefinite length. Furthermore, within scanning distance 152, the swept lines are all adjacent to one another.

Figure 7:
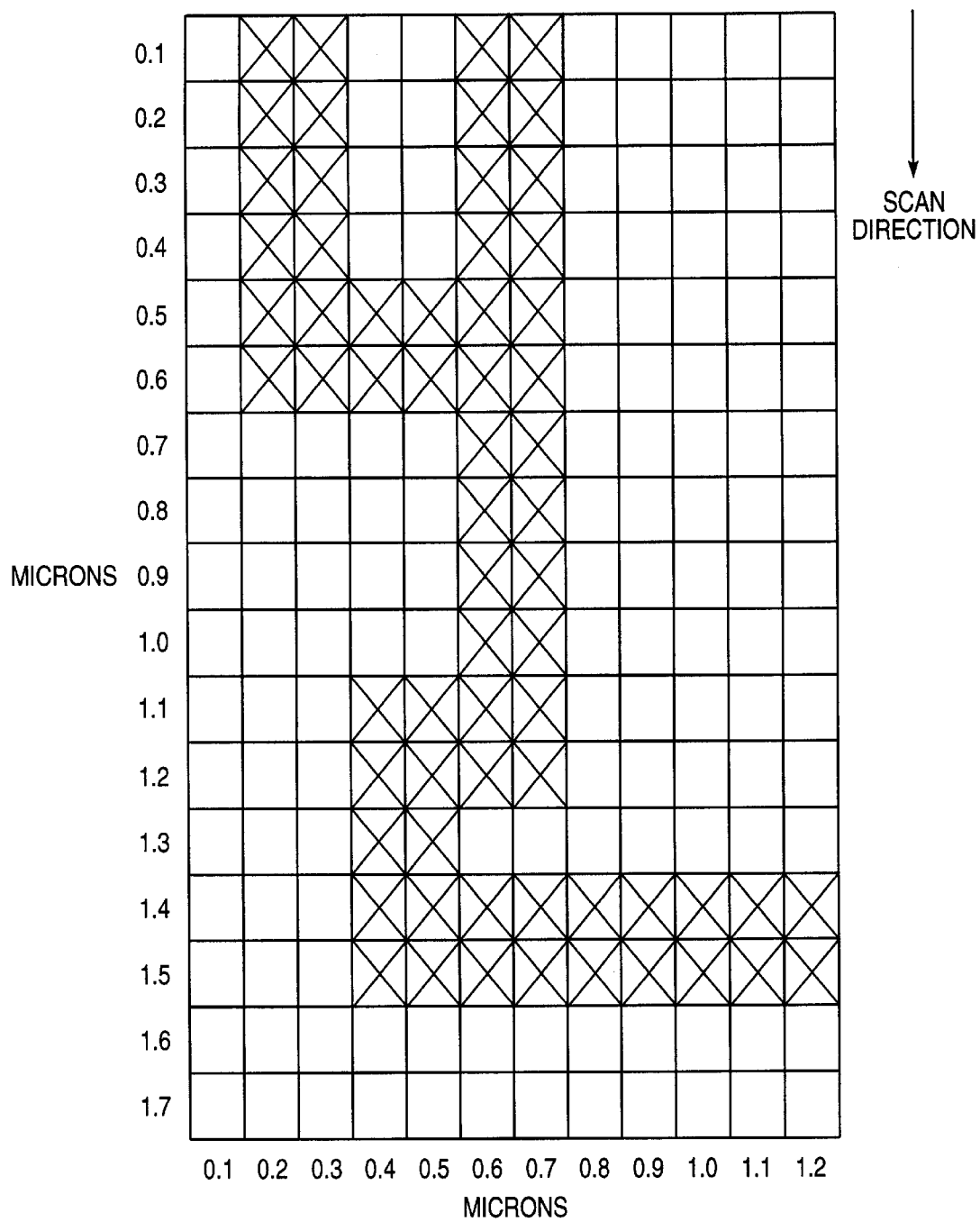
FIG. 7 is a plan view of an image pattern formed by the radiation sources.

FIG. 7 is a plan view of an image pattern provided by radiation sources 34. The image pattern is formed on an image plane, such as a region of photoresist defined by rows and columns.

The combined lengths of radiation sources 34 cover a single row, and each of the radiation sources 34 sweeps a single column. For illustration purposes, each row is 1.2 microns wide and extends 0.1 microns in the scan direction, each column is 0.1 microns wide and extends 1.7 microns in the scan direction, and the exposure field of each radiation source 34 has a 0.1 micron diameter. The regions (or cells) containing an "X" have been irradiated, whereas the regions left blank are non-irradiated. Thus, the image pattern provided by radiation sources 34 consists of all the regions containing an "X".

For example, when radiation sources 34a are above the first row extending between 0 to 0.1 microns in the scan direction, the second, third, sixth and seventh radiation sources 34a are activated (project radiation) while the other radiation sources 34a are deactivated (fail to project radiation). When radiation sources 34a are above the fifth row extending between 0.4 to 0.5 microns in the scan direction, the second through seventh radiation sources 34a are activated while the other radiation sources 34a are deactivated. Likewise, when radiation sources 34a are above the fourteenth row extending 1.3 to 1.4 microns in the scan direction, the first three radiation sources 34a are deactivated while the remaining nine radiation sources 34a are activated. Thus, when radiation sources 34a are above a given row, the radiation sources 34a that are activated irradiate the underlying region in their respective column as indicated by an "X", and the radiation sources 34a that are deactivated fail to irradiate the underlying region in their respective column as indicated by leaving the region blank.

Radiation sources 34b can provide the same image pattern in a similar manner. The key difference between radiation sources 34a and 34b is that radiation sources 34a pattern entire rows one at a time, whereas radiation sources 34b patterns portions of rows three rows at a time. For example, when row 50 of radiation sources 34b is above the first row extending 0 to 0.1 microns in the scan direction, the first and second radiation sources 34b in row 50 are activated to irradiate the third and sixth columns at the first row while the other radiation sources 34b are deactivated. When radiation sources 34b are shifted 0.1 microns in the scan direction, row 48 of radiation sources 34b is above the first row extending between 0 and 0.1 microns in the scan direction, and row 50 of radiation sources 34b is above the second row extending between 0.1 and 0.2 microns in the scan direction, in which case the first two radiation sources 34b in row 50 are activated to irradiate the third and sixth columns at the second row, the first radiation source 34b in row 48 is activated to irradiate the second column at the first row, and the other radiation sources 34b are deactivated.

Likewise, after radiation sources 34b are shifted another 0.1 microns in the scan direction, row 50 of radiation sources 34b is above the third row extending between 0.2 and 0.3 microns in the scan direction, row 48 of radiation sources 34b is above the second row extending between 0.1 and 0.2 microns in the scan direction, and row 46 of radiation sources 34b is above the first row extending between 0 and 0.1 microns in the scan direction. In this instance, the first two radiation sources in row 50 are activated to irradiate the third and sixth columns at the third row, the first radiation source 34b in row 48 is activated to irradiate the second column at the second row, the third radiation source 34b in row 46 is activated to irradiate the seventh column at the first row, and the other radiation sources 34b are deactivated.

The image pattern has a minimum feature size of 0.2 microns, for instance, due to the minimum resolution of the photoresist. Since the radiation sources have an exposure field of 0.1 microns on the image plane, at least two of the radiation sources must be activated to pattern the minimum feature size. More preferably, the radiation sources have an exposure field on the order of one-fifth to one-tenth the minimum feature size, and therefore between five to ten of the radiation sources must be activated to pattern the minimum feature size. For instance, to accommodate features on the order of 0.1 to 0.25 microns, the exposure fields of the radiation sources can have a diameter on the order of 0.01 to 0.05 microns.

Of importance, adjacent exposure fields need not necessarily overlap or form a continuously irradiated region in order to achieve the desired patterning. Suppose the second and third radiation sources 34a provide exposure fields 134a with a 0.01 micron gap therebetween. When the first six rows are scanned, 0.01 microns of photoresist between the second and third columns remains non-irradiated. However, if the photoresist is positive-acting and has a minimum resolution of 0.2 microns, then the 0.01 micron-wide strip will be removed as though it were irradiated since the strip is far narrower than the minimum resolution of the photoresist.

The image pattern may consist of either parallel lines or pixels. The parallel lines have essentially identical widths (similar to the column widths) but varying lengths (depending on how many rows a line spans) and are formed in respective columns. The pixels have essentially identical shapes and sizes, and are formed in selected cells. For instance, the second radiation source 34 can pattern the second column by being continuously activated as it sweeps across the first six rows and then continuously deactivated as it sweeps across the remaining rows. This forms a single irradiated line extending across the first six rows in the second column. Alternatively, the second radiation source 34 can irradiate the second column by being activated then deactivated, row-by-row, as it sweeps across each of the first six rows, and then continuously deactivated as it sweeps across the remaining rows. This forms six individual pixels in the second column, with one pixel per row in the first six rows.

In the event the pixels are formed, it is not essential that adjacent pixels overlap one another. For instance, if the second radiation source 34a patterns the first and second rows of the second column with a pair of pixels having a 0.01 micron gap therebetween, and the photoresist is positive-acting with a minimum resolution of 0.2 microns, then the 0.01 microns of non-irradiated photoresist in the second column between the first and second rows will be removed as though it were irradiated.

It should be noted that even though the image pattern may consist of parallel lines or pixels, the image pattern may generally appear to have diagonal lines, curved lines, or various other features in a similar manner to text printed by a dot matrix or laser printer at 300 to 600 dpi.

Figure 8:
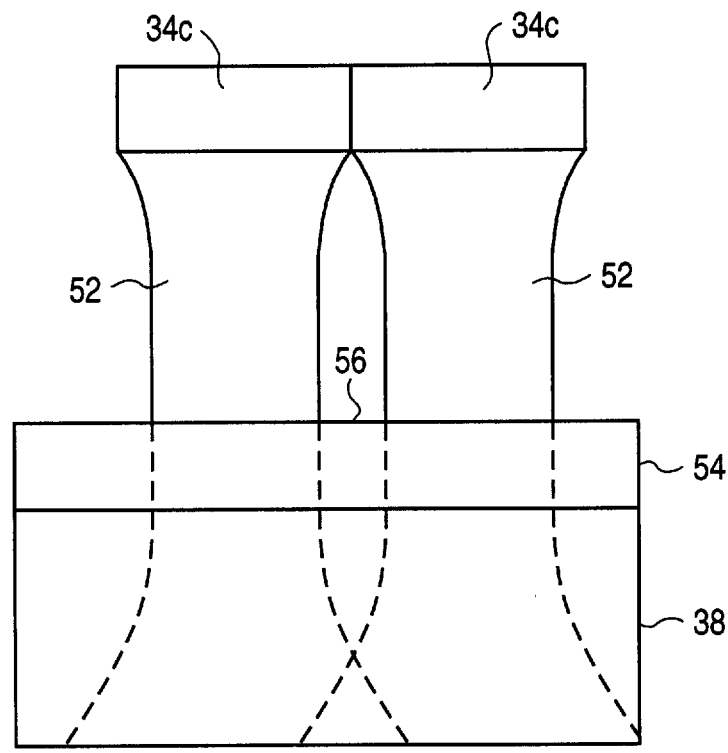
FIG. 8 is an illustration of laser diode radiation sources.

FIG. 8 illustrates radiation sources 34 implemented by laser diodes that provide high-intensity laser beams with sharp focus that can be modulated at very high speeds. Adjacent laser diodes 34c emit laser beams 52 in the form of gaussian beams. That is, laser beams 52 each converge to a minimum diameter, retain the minimum diameter for a finite distance, and then disperse. Preferably, the displacement between laser diodes 34c and photoresist 54 coated on wafer 38 permits the minimum diameter region of laser beams 52 to strike photoresist 54. For illustration purposes, the dispersion of laser beams 52 in the absence of photoresist 54 and wafer 38 is shown by the broken lines. As is seen, portion 56 of photoresist 54 between laser beams 52 remains non-irradiated even when the adjacent laser diodes 34c are activated. However, as mentioned above, if the length of portion 56 is significantly smaller than the resolution of photoresist 54, then pattern fidelity can be maintained.

Figure 9:
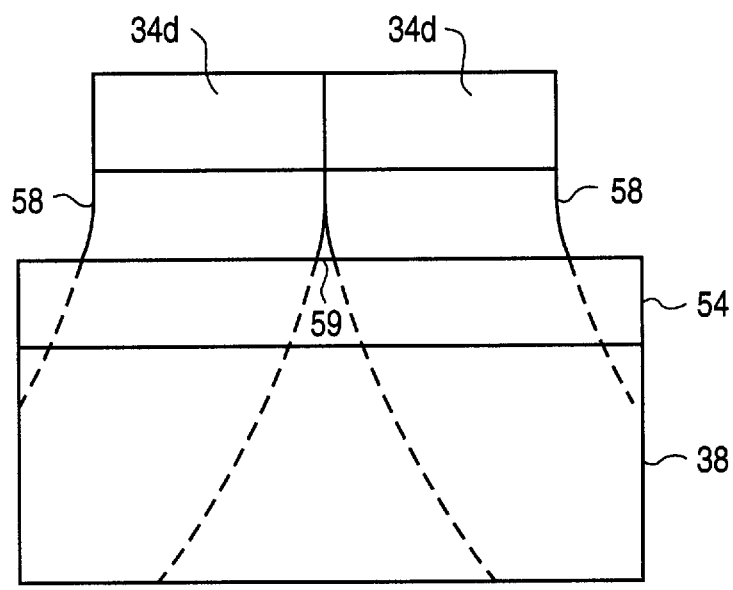
FIG. 9 is an illustration of light emitting diode radiation sources.

FIG. 9 illustrates radiation sources 34 implemented by light emitting diodes that provide high-intensity light spots with moderate focus that can be modulated at very high speeds. Adjacent light emitting diodes 34d emit light outputs 58 that constantly disperse. The displacement between light emitting diodes 34d and photoresist 54 provides for well-controlled light spots that strike photoresist 54. For illustration purposes, the dispersion of light outputs 58 from light emitting diodes 34d in the absence of photoresist 54 and wafer 38 is shown by the broken lines. As is seen, the light spots that strike photoresist 54 slightly overlap one another at portion 59 of photoresist 54. However, if desired, a non-irradiated portion of photoresist 54 between the light spots can be achieved, for instance, by increasing the displacement between light emitting diodes 34d. Likewise, the dispersion of light outputs 58 can be limited by introducing focusing elements. Furthermore, if the overlap between the adjacent light spots is significantly smaller than the resolution of photoresist 54, then pattern fidelity can be maintained.

FIGS. 10 through 13 illustrate various scanning techniques that are suitable for the invention. The preferred scanning technique depends, in part, on the combined lengths of the radiation sources relative to the diameter of the wafer, and the movement capability of the radiation sources and the wafer. With all the scanning techniques, it is preferred that the displacement between the radiation sources and the wafer remain relatively constant, on the order of a few hundred microns. Moreover, the displacement between the radiation sources themselves remains constant during scanning, that is, the radiation sources remain stationary with respect to one another.

Figure 10:
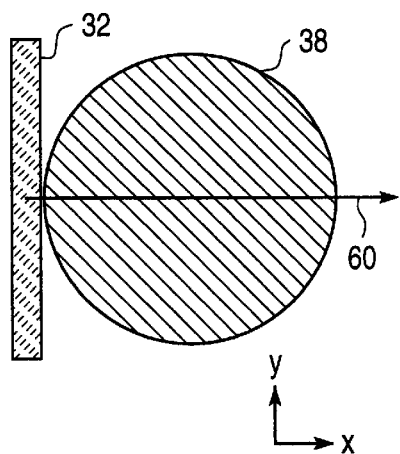
FIGS. 10–13 are illustrations of various scanning techniques.

FIG. 10 illustrates a scanning technique used when radiation sources 34 are movable, wafer 38 is stationary, and the combined length of radiation sources 34 is greater than the diameter of wafer 38. In this instance, radiation exposure device 32 sweeps across the entire wafer 38 in a single pass in the x-direction along path 60.

Figure 11:
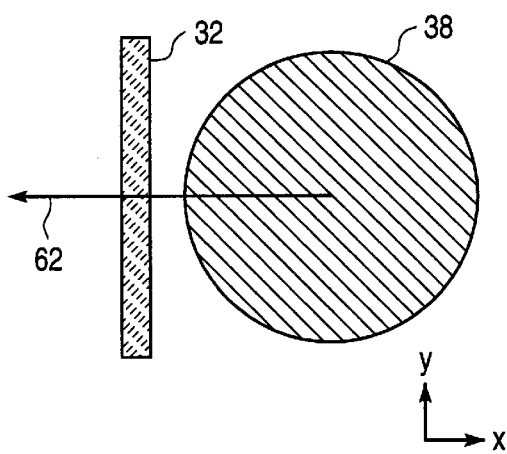

FIG. 11 illustrates a scanning technique used when radiation sources 34 are stationary, wafer 38 is movable, and the combined length of radiation sources 34 is greater than the diameter of wafer 38. In this instance, wafer 38 sweeps across radiation exposure device 32 in a single pass in the x-direction along path 62.

Figure 12:
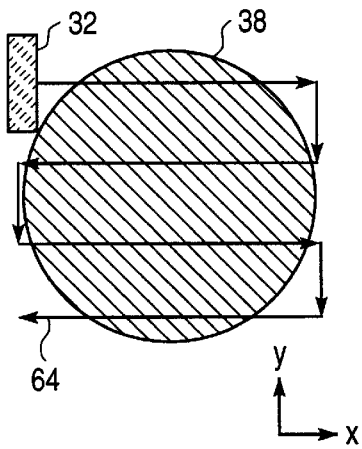

FIG. 12 illustrates a scanning technique used when radiation sources 34 are movable, wafer 38 is stationary, and the combined length of radiation sources 34 is smaller than the diameter of wafer 38. In this instance, radiation exposure device 32 sweeps across portions of wafer 38 in the x-direction at various positions in the y-direction. Radiation sources 34 are selectively activated to provide portions of the image pattern as radiation exposure device 32 is actuated in the direction, whereas radiation sources 34 are all deactivated as radiation exposure device 32 is stepped in the y-direction for another x-direction pass. Thus, the scanning includes multiple passes in the x-direction along path 64.

Figure 13:
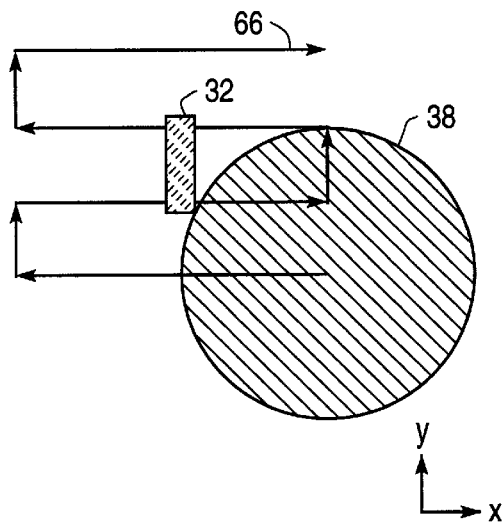

FIG. 13 illustrates a scanning technique used when radiation sources 34 are stationary, wafer 38 is movable, and the combined length of radiation sources 34 is smaller than the diameter of wafer 38. In this instance, portions of wafer 38 sweep across radiation exposure device 32 in the x-direction at various positions in the y-direction. Radiation sources 34 are selectively activated to provide portions of the image pattern as wafer 38 is actuated in the x-direction, whereas radiation sources 34 are all deactivated as wafer 38 is stepped in the y-direction for another x-direction pass. Thus, the scanning includes multiple passes in the x-direction along path 66.

Preferably, the photoresist is patterned by single exposures from the activated radiation sources. However, multiple exposures may be necessary, depending, for instance, on the sensitivity of the photoresist, the power of the radiation sources, the distance between the radiation sources and the photoresist, and the duration of the exposure. If continuous scanning is used, multiple exposures can be provided by re-scanning the same regions and repeating the exposure pattern. If step and repeat scanning is used, multiple exposures can be provided at each step.

The scanning and activation of the radiation sources are controlled by a computer that accesses a data file (or a layout file) indicative of the desired pattern. The computer controls the motion of the radiation sources relative to the wafer by actuating a highly accurate positioning mechanism such as a laser interferometer. The computer also controls the activation and deactivation of the radiation sources as a function of the relative position between the radiation sources and the wafer.

Numerous variations exist for the above embodiments. The invention can be carried out using radiation with various wavelengths, including x-rays, ultraviolet, visible and infrared, by using suitable radiation sources and optical components. The radiation sources can be individual emitters, such as laser diodes and light emitting diodes, or alternatively individually gated channels coupled to a single emitter, such as light pipes of glass fiber that gather radiation from a bulk x-ray source. The exposure fields can assume various shapes including circles, ovals, hexagons, etc. The wavelength of the radiation depends in part on the desired resolution, since the wavelength is usually smaller than the exposure field. The deactivated radiation sources can project a limited amount of radiation that is distinguishable from the image pattern. For instance, the exposure fields of the activated/deactivated radiation sources can be above/below the sensitivity of the photoresist. Various photosensitive materials (both positive and negative) or photosensitive detectors can be used to provide the image plane. The scanning can be accomplished by moving the radiation sources, the wafer, or both, as long as the radiation sources move relative to the wafer. Preferably, the region between the radiation sources and the image plane is devoid of optical elements. The invention is well-suited for providing image patterns in a variety of optical projection systems.

Those skilled in the art will readily implement the steps necessary to provide the structures and methods disclosed herein, and will understand that the process parameters, materials, dimensions, and sequence of steps are given by way of example only and can be varied to achieve the desired result as well as modifications which are within the scope of the invention. Variations and modifications of the embodiments disclosed herein may be made based on the description set forth herein, without departing from the spirit and scope of the invention as set forth in the following claims.

What is claimed is:

1. A method of using a photolithographic system, comprising:

providing individually controllable radiation sources; and scanning the radiation sources relative to an image plane to form the image pattern on the image plane during fabrication of an integrated circuit device.

2. The method of claim 1, wherein the radiation sources are arranged as a linear array with a single row.

3. The method of claim 1, wherein the radiation sources are arranged as a staggered array with multiple rows.

4. The method of claim 1, wherein the radiation sources are selected from the group consisting of light pipes, light emitting diodes and laser diodes.

5. The method of claim 1, wherein the radiation sources that are activated emit radiation selected from the group consisting of ultraviolet light and x-rays.

6. The method of claim 1, wherein the scanning includes holding the radiation sources stationary while moving the image plane.

7. The method of claim 1, wherein the scanning includes holding the image plane stationary while moving the radiation sources.

8. The method of claim 1, wherein at least two of the radiation sources must be activated for each feature in the image pattern.

9. The method of claim 1, wherein the image plane is provided by a photosensitive material on a wafer.

10. The method of claim 1, wherein the radiation sources form the image pattern without using a reticle or a mask.

11. A method of using a photolithographic system to form an image pattern without using a reticle or mask during fabrication of an integrated circuit device, comprising:

providing individually controllable radiation sources;

providing a photosensitive material on a wafer; and scanning the radiation sources relative to the photosensitive material, and selectively activating the radiation sources during the scanning, in order to selectively irradiate the photosensitive material and form the image pattern on the photosensitive material.

12. The method of claim 11, wherein the radiation sources are arranged as a linear array with a single row and the scanning occurs in a direction orthogonal to the row.

13. The method of claim 11, wherein the radiation sources are arranged as a staggered array with multiple rows that are staggered relative to one another, and the scanning occurs in a direction orthogonal to the rows.

14. The method of claim 11, wherein the scanning includes forming the image pattern over substantially all of the wafer using a single pass.

15. The method of claim 11, wherein the scanning includes forming the image pattern over substantially all of the wafer using multiple passes, such that each of the passes forms a separate portion of the image pattern over a separate portion of the wafer.

16. The method of claim 15, wherein each of the multiple passes occurs in the x-direction, and the multiple passes are offset relative to one another in the y-direction.

17. The method of claim 11, wherein the scanning includes maintaining a substantially constant displacement between the radiation sources and the photosensitive material.

18. The method of claim 11, wherein the scanning includes maintaining a substantially constant displacement between the radiation sources.

19. The method of claim 11, wherein the radiation sources that are activated emit radiation selected from the group consisting of ultraviolet light and x-rays.

20. The method of claim 11, wherein the radiation sources are selected from the group consisting of light pipes, light emitting diodes and laser diodes.

21. The method of claim 11, wherein the image pattern includes features having a minimum line width, and at least two of the radiation sources must be activated to provide the minimum line width.

22. The method of claim 21, wherein at least five of the radiation sources must be activated to provide the minimum line width.

23. The method of claim 11, wherein each of the radiation sources that is activated provides an exposure field of less than 0.1 microns on the image plane.

24. The method of claim 11, further including developing the photosensitive material after the scanning, thereby selectively exposing a region of the wafer that corresponds to the image pattern.

25. The method of claim 11, wherein the image pattern consists of pixels, the pixels have essentially identical sizes and shapes, and each of the pixels is formed by activating then deactivating a selected one of the radiation sources.

26. The method of claim 11, wherein the image pattern consists of parallel lines, the parallel lines have essentially identical widths and varying lengths, and each of the parallel lines is formed by activating then deactivating a selected one of the radiation sources.

27. The method of claim 11, wherein the scanning occurs continuously, and the radiation sources are selectively activated as they move relative to the wafer.

28. The method of claim 11, wherein the scanning occurs in a step and repeat fashion, and the radiation sources are selectively activated as they are held stationary relative to the wafer.

29. The method of claim 11, wherein the radiation sources are essentially identical to one another.

30. A method of using a photolithographic system to selectively expose a wafer without using a reticle or mask during fabrication of an integrated circuit device, comprising:

providing individually controllable radiation sources for selectively emitting radiation selected from the group consisting of ultraviolet light and x-rays, wherein the radiation sources are essentially identical to one another;

providing photoresist on a wafer;

scanning the radiation sources relative to the photoresist, and selectively activating and deactivating the radiation sources during the scanning in order to selectively irradiate regions of the photoresist with an image pattern, wherein at least two of the radiation sources are activated to form each feature in the image pattern; and developing the photoresist to remove the irradiated regions and selectively expose the wafer at regions corresponding to the image pattern.

31. A method of fabricating an integrated circuit device, comprising:

depositing a photosensitive material over the device; and forming an image pattern on the photosensitive material by scanning individually controllable radiation sources with respect to the photosensitive material and selectively activating the radiation sources during the scanning.

32. A method of using individually controllable radiation sources in a photolithographic system to provide an image pattern for fabricating an integrated circuit device, comprising:

providing a photosensitive material on a wafer; and scanning the radiation sources relative to the photosensitive material and selectively activating the radiation sources during the scanning in order to provide an image pattern on the photosensitive material during fabrication of the integrated circuit device.

33. In a photolithographic system for fabricating integrated circuit devices, a method of defining device features, comprising:

scanning individually controllable radiation sources relative to a photosensitive material on a wafer; and selectively activating the radiation sources during the scanning to form an image pattern on the photosensitive material that is used to define the device features.

34. In a photolithographic system for fabricating integrated circuit devices, a method of defining device features of an integrated circuit device, comprising:

scanning individually controllable radiation sources relative to photoresist on a wafer; and selectively activating and deactivating the radiation sources during the scanning to form an image pattern on the photoresist that is used to define the device features.

35. The method of claim 34, wherein the radiation sources are individual radiation emitters.

36. The method of claim 35, wherein the radiation sources are laser diodes.

37. The method of claim 35, wherein the radiation sources are light emitting diodes.

38. The method of claim 34, wherein the radiation sources are gated channels coupled to a single radiation emitter.

39. The method of claim 38, wherein the radiation sources are light pipes.

40. The method of claim 38, wherein the radiation sources are glass fibers.

41. The method of claim 38, wherein the single radiation emitter is a bulk x-ray source.

42. The method of claim 34, wherein the radiation is infrared light.

43. The method of claim 34, wherein the radiation is visible light.

44. The method of claim 34, wherein the radiation is ultraviolet light.

45. The method of claim 34, wherein the radiation is x-rays.

46. The method of claim 34, wherein the radiation sources that are activated project an amount of radiation that is above a sensitivity of the photoresist, and the radiation sources that are deactivated project a limited amount of radiation that is below the sensitivity of the photoresist.

47. The method of claim 34, wherein a region between the radiation sources and the image pattern is devoid of optical elements.

48. The method of claim 34, wherein the scanning occurs without interlaced scanning.

* * * * *